United States Patent [19]
Chikugawa et al.

[11] Patent Number: 5,127,015
[45] Date of Patent: Jun. 30, 1992

[54] DRIVING CIRCUIT OF A SEMICONDUCTOR LASER

[75] Inventors: Hiroshi Chikugawa, Kashihara; Masaru Ogawa, Nara; Kunio Suzuki, Kashihara, all of Japan

[73] Assignee: Sharp Kabushiki Kaisha, Osaka, Japan

[21] Appl. No.: 686,783

[22] Filed: Apr. 17, 1991

[30] Foreign Application Priority Data

Apr. 17, 1990 [JP] Japan .................. 2-40974[U]
Sep. 28, 1990 [JP] Japan .................. 2-262712

[51] Int. Cl.⁵ .................................................. H01S 3/13
[52] U.S. Cl. ................................... 372/38; 372/29
[58] Field of Search ............................... 372/38, 29

[56] References Cited
U.S. PATENT DOCUMENTS 4,355,395 10/1982 Salter et al. ..................... 372/38
4,480,325 10/1984 Aiki et al. ....................... 369/122

FOREIGN PATENT DOCUMENTS 0187074 9/1985 Japan ............................. 372/38
0174786 8/1986 Japan ............................. 372/38

Primary Examiner—Georgia Y. Epps
Attorney, Agent, or Firm—David G. Conlin; Robert M. Asher

[57] ABSTRACT

A driving circuit of a semiconductor laser includes a photodiode receiving a light of the semiconductor laser, a first detecting circuit for calculating a mean value signal of outputs of the semiconductor laser in accordance with an output of the photodiode, a second detecting circuit for calculating a maximum value signal of the outputs of the semiconductor laser, a circuit receiving the mean value signal for supplying a bias current for driving the semiconductor laser, a high-frequency superimposing circuit for modulating the bias current by high-frequency waves, and a modulating degree control circuit comparing the mean value signal with the maximum value signal for making a period of time for which the minimum value of the optical output values of the semiconductor laser becomes zero, in accordance with the comparison results.

3 Claims, 3 Drawing Sheets

DRIVING CIRCUIT OF A SEMICONDUCTOR LASER

BACKGROUND OF THE INVENTION

1. Field of the Invention

The present invention relates to a driving circuit of a high-power semiconductor laser.

2. Description of the Prior Art

Conventionally, as a driving circuit of a semiconductor laser, that as shown in FIG. 3 is employed. The driving circuit of a semiconductor laser includes a monitor type photodiode 32, a bias current circuit 34, a high-frequency superimposing circuit 35 and a coupling capacitor 33. When a semiconductor laser 31 is employed with low output for reading data in an optical magnetic disc, for example, a driving bias current Ib supplied by the bias current circuit 34 is modulated by a high frequency, and the high-frequency-modulated current is used to drive the semiconductor laser 31. At this time, the photodiode 32 receives a light emitted by the semiconductor laser 31 and outputs an optical output detecting signal expressing an optical output value of the semiconductor laser 31 to the bias current circuit 34. Then, the bias current circuit 34 regulates the bias current Ib so that the mean value of the optical output values of the semiconductor laser 31 keeps constant. An example of an operating state of the semiconductor laser 31 is shown in FIG. 4. In FIG. 4, F is an optical output characteristic of the semiconductor laser 31, while $Q_0$ is a high-frequency-modulated waveform of the high-frequency superimposing circuit 35. Moreover, Ith denotes a threshold current of the semiconductor laser 31; when a current flowing into the semiconductor laser 31 is the threshold current Ith or under, an optical output P of the semiconductor laser 31 becomes zero, and the oscillation of the semiconductor laser 31 ceases. The optical output characteristic F of the semiconductor laser 31 is defined by an optical output characteristic value, such as a differential efficiency $\eta$ which is a variation in the optical output P related to a variation in the bias current Ib in an induced emission region, the above-mentioned threshold current Ith and the like. The optical output waveform $P_0$ of the semiconductor laser 31 is, as shown in FIG. 4, adapted to intermittently have periods of time for which it becomes zero. For this reason, the semiconductor laser 31 intermittently repeats a halt and resumption of laser oscillation, and it comes to easily cause a multimode oscillation. The semiconductor laser 31 decreases a noise, such as a mode hopping noise, a noise resulting from a return light and the like, to the optical output of the semiconductor laser 31.

In general, however, semiconductor lasers have their respective significantly different optical output characteristic values, such as the threshold current Ith, the differential efficiency $\eta$ in the induced emission region and the like, which are determined by the optical output characteristics of the semiconductor lasers. Thus, in the conventional driving circuit of the semiconductor laser, because of an unevenness of the optical output characteristic values of the semiconductor laser 31, the optical output waveform of the semiconductor laser 31 does not identical with the optical output waveform $P_0$ having periods of time for which the optical output value becomes zero as shown in FIG. 4, and it is possible that there is no period of time for which the optical output value becomes zero. In this case, since the semiconductor laser 31 does not intermittently repeat a halt and resumption of laser oscillation, the multimode oscillation by which the noise, such as the mode hopping noise and the like, to the optical outputs can be reduced is not easily caused.

The mode hopping noise herein means a noise caused when a vertical mode hops due to a slight change in temperature or the like in a laser without hysteresis.

U.S. Pat. No. 4,480,325 discloses an optical pickup provided with a semiconductor laser device which uses D. C. current and a high frequency current superposed thereon to project laser beam onto an optical disc.

SUMMARY OF THE INVENTION

The present invention provides a driving circuit of a semiconductor laser in which a modulation degree of a high-frequency superimposing circuit is automatically regulated in accordance with an optical output value of a semiconductor laser even if optical output characteristic values of the semiconductor laser are uneven, so that a multimode oscillation of the semiconductor laser can be easily generated and a noise to an optical output of the semiconductor laser can be assuredly reduced by the multimode oscillation.

The driving circuit of a semiconductor laser according to the present invention comprises a photodiode receiving light from a semiconductor laser to output an optical output detecting signal which expresses an optical output value of the semiconductor laser, a means value detecting circuit receiving the optical output detecting signal from the photodiode and detecting a mean value of the optical output values of the semiconductor laser to output a mean value signal which expresses the mean value of the optical output value, a maximum value detecting circuit receiving the optical output detecting signal from the photodiode to output a maximum value signal which expresses the maximum value of optical output values of the semiconductor laser, a bias current circuit receiving the mean value signal from the mean value detecting circuit to supply a bias current for a drive to the semiconductor laser so that the mean value of the optical output values of the semiconductor laser keeps constant, a high-frequency superimposing circuit for modulating the bias current supplied by the bias current circuit by high-frequency waves, and a modulation degree control circuit receiving the mean value signal from the mean value detecting circuit and the maximum value signal from the maximum value detecting circuit to perform a comparison operation of the means value signal with the maximum value signal, for controlling a modulation degree of the high-frequency superimposing circuit in accordance with the results of the comparison operation so that there is a period of time for which the minimum value of the optical output values of the semiconductor laser is zero.

The high-frequency superimposing circuit modulates a bias current from the bias current circuit by a high frequency. Then, the semiconductor laser receives the high-frequency modulated bias current to generate a high-frequency modulated light. The photodiode receives the light from the semiconductor laser and outputs an optical output detecting signal expressing an optical output value of the semiconductor laser to the mean value detecting circuit and the maximum value detecting circuit. Then, the means value detecting cirsemiconductor laser in accordance with the optical output detecting signal from the photodiode and outputs a mean value signal expressing the mean value of the optical output values. The maximum value detecting circuit detects the maximum value of optical output values of the semiconductor laser in accordance with the optical output detecting signal from the photodiode and outputs the maximum value signal expressing the maximum value of the optical output value. Then, the bias current circuit receives the means value signal from the mean value detecting circuit to supply a bias current to the semiconductor laser so that the mean value of the optical output values of the semiconductor laser keeps constant. On the other hand, the modulation degree control circuit receives the mean value signal from the mean value detecting circuit and the maximum value signal from the maximum value detecting circuit to perform a comparison operation of the mean value signal with the maximum value signal and controls a modulation degree of the high-frequency superimposing circuit in accordance with the results of the comparison operation so that there is a period of time for which the minimum value of the optical output value of the semiconductor laser becomes zero. Thus, even if an optical output characteristic of the semiconductor laser is uneven, the semiconductor laser always intermittently repeats a halt and resumption of a laser oscillation and easily causes a multimode oscillation, so that a noise to the optical output of the semiconductor laser can be assuredly reduced by the multimode oscillation.

DESCRIPTION OF THE DRAWINGS

An embodiment of the invention will now be described by way of example and with reference to the accompanying drawings, in which.

DESCRIPTION OF THE PREFERRED EMBODIMENTS

Now, the present invention will be described in detail in conjunction with embodiments shown in the accompanying drawings.

Figure 1:
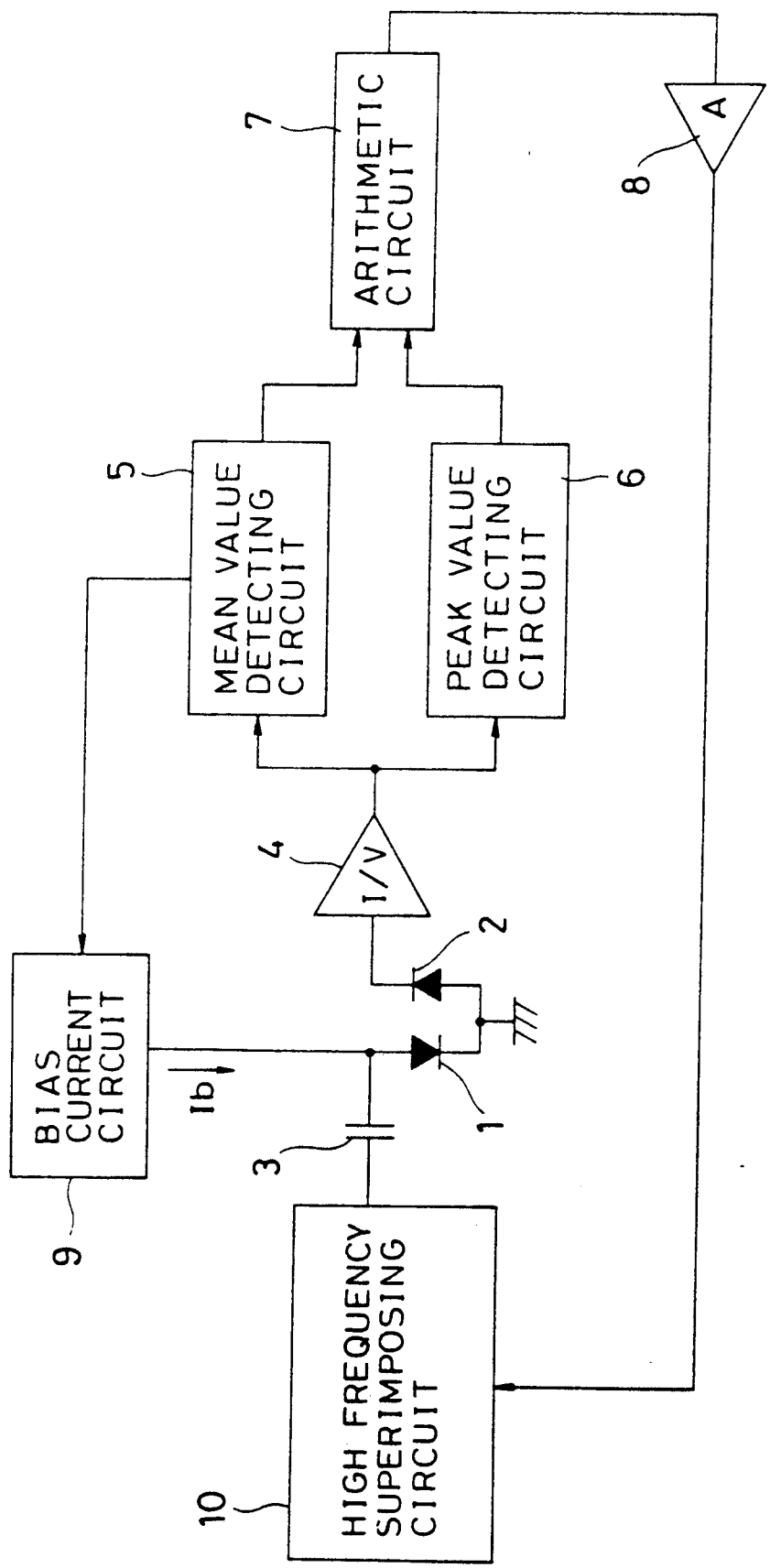
FIG. 1 is a block diagram of a driving circuit of a semiconductor laser of an embodiment according to the present invention.

FIG. 1 is a block diagram showing a driving circuit of a semiconductor laser of this embodiment. As shown in FIG. 1, the driving circuit of the semiconductor laser comprises a photodiode 2, a coupling capacitor 3, a bias current circuit 9 and a high-frequency superimposing circuit 10. The bias current circuit 9 supplies a bias current Ib to the high-frequency superimposing circuit 10, and the high-frequency superimposing circuit 10 high-frequency modulates the bias current Ib. The high-frequency modulated bias current Ib is used to drive the semiconductor laser 1. The driving circuit comprises a current-voltage transducing circuit 4, a mean value detecting circuit 5, a peak value detecting circuit 6 serving as a maximum value detecting circuit, an arithmetic circuit 7 and an amplifying circuit 8. Of the arithmetic circuit 7 and the amplifying circuit 8, a modulation degree control circuit is composed.

In the above system architecture, the photodiode 2 receives light from the semiconductor laser 1 and outputs an optical output detecting signal expressing an optical output value of the semiconductor laser 1. Then, the current-voltage transducing circuit 4 receives the optical output detecting signal from the photodiode 2 and transduces the optical output detecting signal into a voltage signal to output the transduced optical output detecting signal, or the voltage signal. The mean value detecting circuit 5 receives the transduced optical output detecting signal, or the voltage signal, from the current-voltage transducing circuit 4 and detects a mean value of optical output values of the semiconductor laser 1 to output a mean value signal expressing the mean value of the optical output values. The peak value detecting circuit 6 receives the transduced optical output detecting signal, or the voltage signal, from the current-voltage transducing circuit 4 and detects the maximum value of the optical output value of the semiconductor laser 1 to output a maximum value signal expressing the maximum value of the optical output values. Then, the bias current circuit 9 receives the mean value signal from the mean value detecting circuit 5 and supplies the bias current Ib to the semiconductor laser 1 so that the mean value of the optical output values of the semiconductor laser 1 keeps constant. The arithmetic circuit 7 receives the mean value signal from the mean value detecting circuit 5 and the maximum value signal from the peak value detecting circuit 6 and executes a comparison operation of the mean value signal with the maximum value signal to output the results of the comparison operation. The amplifying circuit 8 receives the results of the comparison operation from the arithmetic circuit 7 and amplifies the results of the comparison operation to output them to the high-frequency superimposing circuit 10. Thus, the modulation degree control circuit composed of the arithmetic circuit 7 and the amplifying circuit 8 controls a modulation degree of the high-frequency superimposing circuit 10 in accordance with the results of the comparison operation so that there is a period of time for which the minimum value of the optical output values becomes zero. For example, when the high-frequency superimposing circuit 10 has a bias current which is outputted by the bias current circuit 9 modulated by sine waves, the modulation degree of the high-frequency superimposing circuit 10 is controlled so that the maximum values of the optical output values of the semiconductor laser 1 is double or more the mean value of the optical output values. In this way, even if an optical output characteristic of the semiconductor laser 1 is uneven, the minimum value of a current supplied to the semiconductor laser 1 equals its threshold current or under, and there is a period of time for which the minimum value of the optical output values of the semiconductor laser 1 becomes zero. Thus, the semiconductor laser 1 comes to intermittently to repeat a halt and resumption of an oscillation, and the semiconductor laser 1 can easily causes a multimode oscillation, so that a noise to an optical output of the semiconductor laser 1 can be assuredly reduced by the multimode oscillation.

Additionally, when the high-frequency superimposing circuit 10 has a bias current which is outputted by the bias current circuit 9 transduced by waves but the sine waves, a modulation degree of the high-frequency superimposing circuit 10 is controlled utilizing a ratio of the maximum value of the optical output values of the semiconductor laser 1 to the mean value so that the ratio is 2 or over. In this way, even if the optical output characteristic of the semiconductor laser 1 is uneven, the minimum value of a current supplied to the semiconductor laser 1 can be its threshold current or under, and there is a period of time for which the minimum value of the optical output values of the semiconductor laser 1 becomes zero. Thus, the semiconductor laser 1 comes to intermittently repeat a halt and resumption of an oscillation, and the semiconductor laser 1 can easily causes a multimode oscillation, so that a noise to an optical output of the semiconductor laser 1 can be assuredly reduced by the multimode oscillation.

As can be recognized in the previous description, in the driving circuit of the semiconductor laser according to the present invention, a photodiode receives a light from a semiconductor laser to output an optical output detecting signal expressing an optical output value of the semiconductor laser, a mean value detecting circuit outputs a mean value signal expressing a mean value of optical output values of the semiconductor laser in accordance with the signal from the photodiode, a maximum value detecting circuit outputs a maximum value signal expressing the maximum value of the optical output values of the semiconductor laser, a modulation degree control circuit receives the mean value signal and the maximum value signal and executes a comparison operation of the mean value signal with the maximum value signal, and a modulation degree of a high-frequency superimposing circuit is controlled in accordance with the results of the comparison operation so that there is a period of time for which the minimum value of the optical output values of the semiconductor laser becomes zero; therefore, the semiconductor laser comes to intermittently repeat a halt and resumption, and the semiconductor laser can easily cause a multimode oscillation, so that a noise to an optical output of the semiconductor laser can be assuredly reduced by the multimode oscillation.

Figure 2:
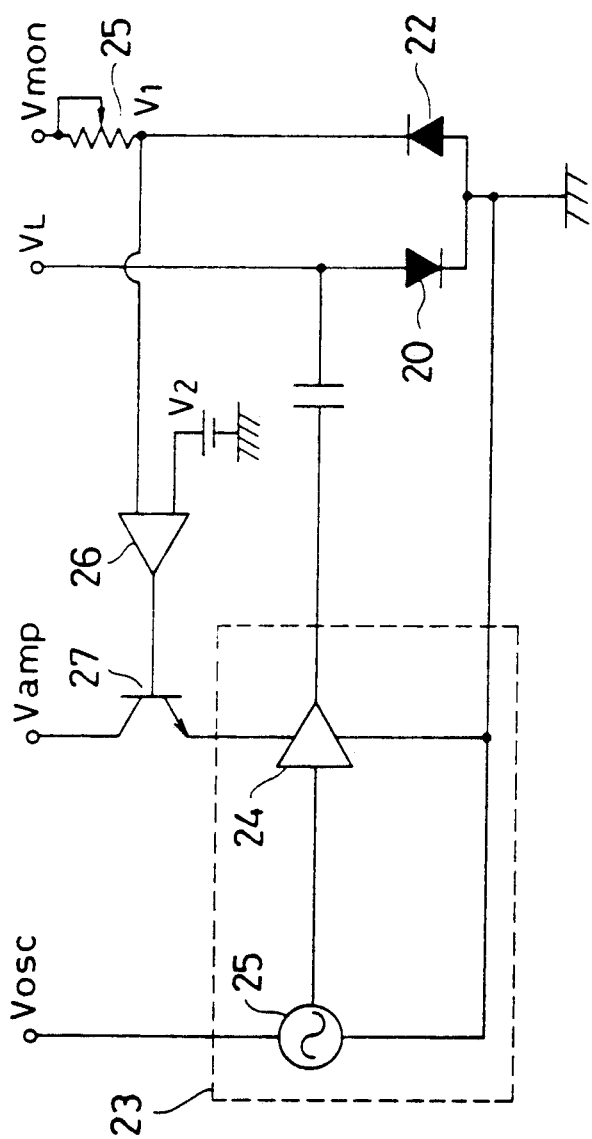
FIG. 2 is a block diagram of a driving circuit of a semiconductor laser of another embodiment according to the present invention.
Figure 3:
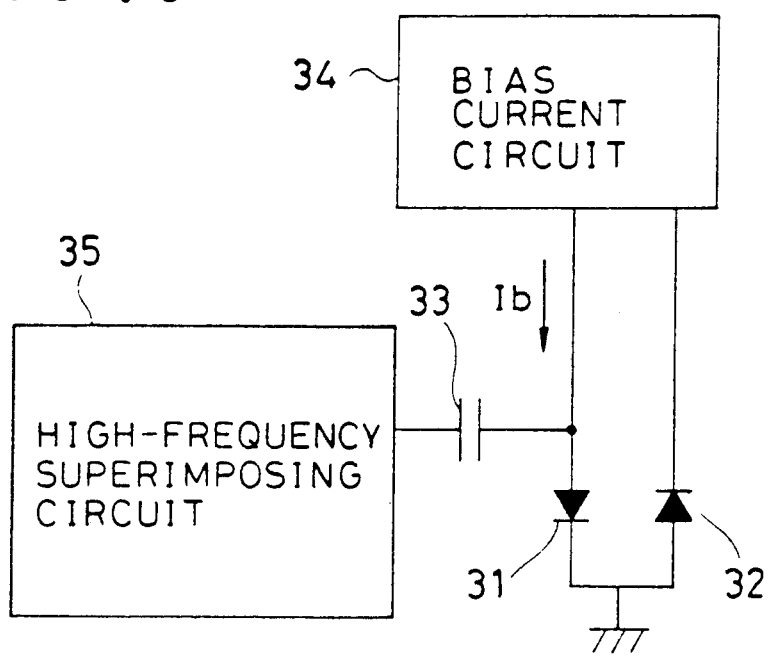
FIG. 3 is a block diagram of a conventional driving circuit of a semiconductor laser.
Figure 4:
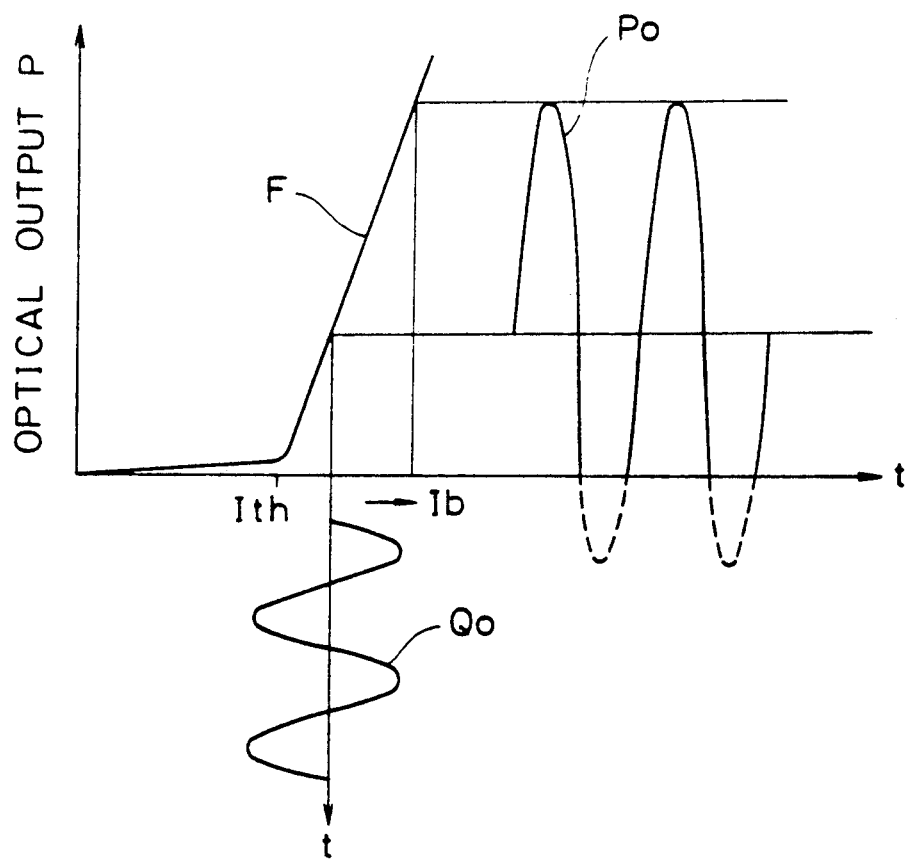
FIG. 4 is a diagram showing an example of a state of the semiconductor laser driven by the conventional driving circuit of the semiconductor laser.

FIG. 2 is a diagram showing another embodiment of a driving circuit of a semiconductor laser automatically switching a high-frequency superimposing in accordance with an optical output or level of the semiconductor laser, presented for explaining another example of a control by the high-frequency superimposing circuit. The laser light can be switched between high and low outputs by varying a voltage applied to a terminal $V_L$ in FIG. 2 or a current supplied to it.

FIG. 2 shows a case in which an output of a semiconductor laser 20 is detected by a packaged monitor type photodiode 22. The photodiode 22 directly monitors the output of the semiconductor laser 20 and transduces the optical output into current. The current is further transduced into voltage $V_1$ by a resistance 25 or the like. The voltage $V_1$ is inputted to a comparator 26 and compared, in advance, with a reference level $V_2$ corresponding to an optical output level for reading signals of the semiconductor laser. If the voltage $V_1$ is smaller than the reference level $V_2$, an output of the comparator 26 is transmitted to a high-frequency superimposing circuit 23, the signal is processed by an amplifying element 24 and a high-frequency oscillator 25 in the high-frequency superimposing circuit 23, and a high-frequency current is supplied to the semiconductor laser 20 by the operating high-frequency oscillator 25.

When the voltage $V_1$ is larger than the reference level $V_2$, an output signal of the comparator 26 causes a breaking of a circuit not to supply the high-frequency current to the semiconductor laser 20.

Reference numeral 27 denotes a transistor which turns ON/OFF in response to the output signal of the comparator 26 for switching a supply of a supply voltage Vamp to the amplifying element 24 in the high-frequency superimposing circuit 23.

There is no problem if an output of the semiconductor laser 20 is detected by a monitor outside the laser package. Moreover, the whole power supply of the high-frequency superimposing circuit 23 may be turned ON/OFF by the output signal of the comparator 26 to switch a supply of the high-frequency current to the semiconductor laser 20.

In a conventional circuit, an output of a monitor type photodiode is checked by an external circuit, and voltage is applied to a terminal or amplifying element corresponding to the terminal $V_{OSC}$ or amplifying element 24 in FIG. 2 in accordance with an external signal; therefore, as to the switching operation of a high-frequency superimposing circuit, a signal inputted to a terminal $V_L$ must be synchronized by the external circuit.

In accordance with this embodiment, a high-frequency superimposing can occur at a timing directly synchronized with a variation in an output of a semiconductor laser. In this way, a superposition does not occur while the semiconductor laser is in high-power operation, and the self-control can work so that the semiconductor laser never operate beyond its absolute maximum rating. In addition to that, the semiconductor laser, superimposing circuit and control circuit can be usefully built in a pickup or the like as a compact unity.

What is claimed is:

1. A driving circuit of a semiconductor laser comprising:
   a photodiode receiving light from a semiconductor laser to output an optical output detecting signal which expresses an optical output value of the semiconductor laser,
   a means value detecting circuit receiving the optical output detecting signal from the photodiode and detecting a mean value of the optical output values of the semiconductor laser to output a mean value signal which expresses the mean value of the optical output values,
   a maximum value detecting circuit receiving the optical output detecting signal from the photodiode to output a maximum value signal which expresses the maximum value of optical output values of the semiconductor laser,
   a bias current circuit receiving the mean value signal from the mean value detecting circuit to supply a bias current for a drive to the semiconductor laser so that the mean value of the optical output values of the semiconductor laser keeps constant,
   a high-frequency superimposing circuit for modulating the bias current supplied by the bias current circuit by high-frequency waves to cause a multimode oscillation of the semiconductor laser, and
   a modulation degree control circuit receiving the mean value signal from the mean value detecting circuit and the maximum value signal from the maximum value detecting circuit to perform a comparison operation of the mean value signal with the maximum value signal, for controlling a modulation degree of the high-frequency superimposing circuit in accordance with the results of the comparison operation so that there is a period of time for which the minimum value of the optical output values of the semiconductor laser is zero.

2. A driving circuit of a semiconductor laser according to claim 1, wherein the high-frequency superimposing circuit controls a modulation degree so that the maximum value of the optical output values of the semiconductor laser is double or more the mean value of the optical output values when the bias current outputted by the bias current circuit is modulated by sine waves, and the semiconductor laser is supplied with a current of which maximum value is its threshold current or under so that the semiconductor laser can intermittently oscillates.

3. A driving circuit of a semiconductor laser comprising:
 a photodiode receiving a light from the semiconductor laser for outputting an optical output detecting signal which expresses an optical output value of the semiconductor laser,
 a detecting circuit receiving the optical output detecting signal from the photodiode for detecting an optical output value of the semiconductor laser,
 a comparator for comparing the optical output value from the detecting circuit with a reference value,
 a bias current circuit for supplying a bias current for a drive to the semiconductor laser,
 a high-frequency superimposing circuit for modulating by a high-frequency waves the bias current supplied by the bias current circuit to cause a multimode oscillation of the semiconductor laser, and
 switching means for causing a high-frequency oscillator in the high-frequency superimposing circuit to turn on in response to an output of the comparator when the optical output value is smaller than the reference value and for causing the high-frequency oscillator to turn off in response to the output of the comparator when the optical output value is larger than the reference value.

* * * * *